United States Patent
Suzuki et al.

(10) Patent No.: US 9,702,945 B2
(45) Date of Patent: Jul. 11, 2017

(54) MAGNETIC MEASUREMENT DEVICE

(71) Applicant: TDK CORPORATION, Tokyo (JP)

(72) Inventors: Kenichi Suzuki, Tokyo (JP); Tsutomu Chikamatsu, Tokyo (JP); Akio Ogawa, Tokyo (JP); Kyung-ku Choi, Tokyo (JP); Ryuji Hashimoto, Tokyo (JP)

(73) Assignee: TDK CORPORATION, Tokyo (JP)

( * ) Notice: Subject to any disclaimer, the term of this patent is extended or adjusted under 35 U.S.C. 154(b) by 183 days.

(21) Appl. No.: 14/374,640

(22) PCT Filed: Dec. 13, 2012

(86) PCT No.: PCT/JP2012/082276
§ 371 (c)(1),
(2) Date: Jul. 25, 2014

(87) PCT Pub. No.: WO2013/111467
PCT Pub. Date: Aug. 1, 2013

(65) Prior Publication Data
US 2014/0375308 A1    Dec. 25, 2014

(30) Foreign Application Priority Data
Jan. 26, 2012  (JP) .................... 2012-014551

(51) Int. Cl.
*G01R 33/12* (2006.01)
*G01R 33/10* (2006.01)

(52) U.S. Cl.
CPC ............. *G01R 33/12* (2013.01); *G01R 33/10* (2013.01); *G01R 33/1215* (2013.01)

(58) Field of Classification Search
CPC .... G01R 33/10; G01R 33/12; G01R 33/1215; G01R 33/14
See application file for complete search history.

(56) References Cited

U.S. PATENT DOCUMENTS

| 3,490,033 A | 1/1970 | Elarde |
| 6,407,545 B1 * | 6/2002 | Sato .................... G01R 33/14 324/212 |

(Continued)

FOREIGN PATENT DOCUMENTS

| CN | 1115384 A | 1/1996 |
| JP | S61-210976 A | 9/1986 |

(Continued)

OTHER PUBLICATIONS

Jan. 5, 2016 Extended European Search Report issued in European Patent Application No. 12866514.8.

(Continued)

*Primary Examiner* — Son Le
(74) *Attorney, Agent, or Firm* — Oliff PLC

(57) ABSTRACT

A magnetic measurement device which can measure the magnetic characteristics in a microregion of a thin plate magnetic sample. After a magnetic sample is applied by a magnetic field and magnetized accordingly, by scanning the magnetic sample using a measuring part, the magnetic flux leakage in the magnetic sample can be measured. The magnetic flux leaks outside by magnetizing a first region and a second region of the magnetic sample in reciprocally opposite directions and reducing the demagnetizing field. Specifically, a magnetic field generating part with at least a pair of magnetic poles is used to perform the magnetization of multiple poles, or the magnetic field generating part applies a damped oscillation magnetic field to perform the magnetization, or a local magnetic field generating part which applies an alternating magnetic field and scans the surface of the sample at the same time is used to perform the magnetization.

3 Claims, 7 Drawing Sheets

(56) References Cited

U.S. PATENT DOCUMENTS

| | | | |
|---|---|---|---|
| 2006/0250129 A1 | 11/2006 | Wu et al. | |
| 2007/0199623 A1 | 8/2007 | Suzuki et al. | |
| 2008/0284422 A1* | 11/2008 | Ishio | B82Y 15/00 |
| | | | 324/226 |
| 2011/0080241 A1* | 4/2011 | Kou | B82Y 25/00 |
| | | | 335/284 |
| 2011/0221438 A1 | 9/2011 | Goodwill et al. | |

FOREIGN PATENT DOCUMENTS

| | | |
|---|---|---|
| JP | S62-294987 A | 12/1987 |
| JP | H06-180304 A | 6/1994 |
| JP | A-2004-206316 | 7/2004 |
| WO | WO 2005/091315 A1 | 9/2005 |

OTHER PUBLICATIONS

Sandomirskii S G: "Application of pole magnetization in magnetic structural analysis (Review)", Russian Journal of Nondestructive Testing, Nauka/Interperiodica, MO, vol. 42, No. 9, Sep. 1, 2006 (Sep. 1, 2006), pp. 586-609.

International Search Report issued in International Application No. PCT/JP2012/082276 mailed Feb. 26, 2013.

International Preliminary Report on Patentability issued in International Application No. PCT/JP2012/082276 issued Jul. 29, 2014.

* cited by examiner

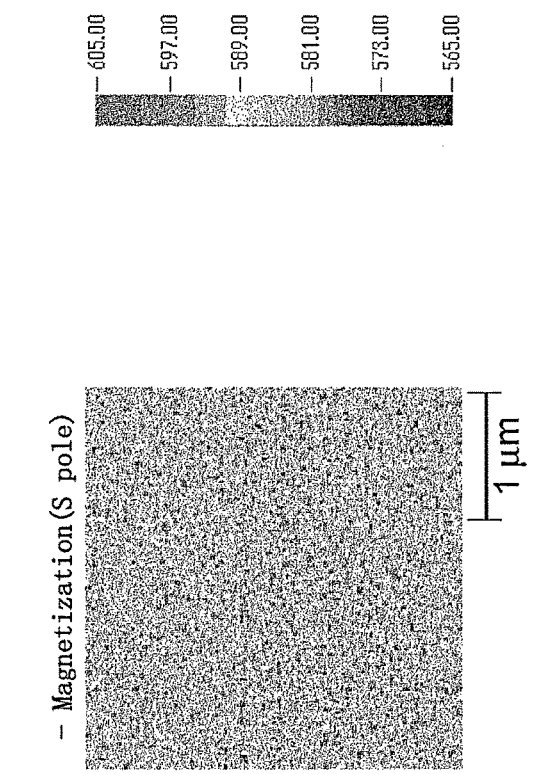
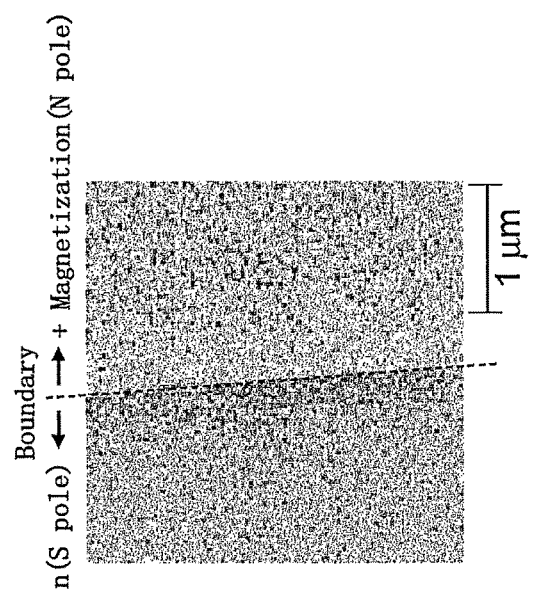
Fig.3(a)
Fig.3(b)

MAGNETIC MEASUREMENT DEVICE

The present invention relates to a magnetic measurement device for measuring the magnetic characteristics especially the magnetic characteristics in a microregion of a thin plate magnetic sample by the measurement of the magnetic flux leakage due to the remanent magnetization.

BACKGROUND

Recently, thin film magnets in minute size (the thickness is about several micrometers to several hundreds of micrometers) have become prepared by physical film formation methods, e.g., sputtering or laser deposition, and have been used in the fields of micromachines or sensors (Patent Document 1). In the application of employing such thin film magnet in the fields of micromachines or sensors, in order to prepare a targeted device, a magnetic circuit is necessarily designed on the base of the magnetic flux leakage due to the remanent magnetization of the thin film magnet, and the distribution of the remanent magnetization (i.e., the remanent magnetization in microregions) of the thin film magnet need to be precisely measured with a resolution of a sub-millimeter level or less.

So far, a B-H curve tracer or a VSM (vibrating sample magneto-meter) has been used in measuring the magnetic characteristics of the magnetic sample. However, these measurement devices can only measure the average magnetic characteristics of the magnetic sample which is the object to be measured, and cannot measure the distribution of the magnetic characteristics, i.e., the characteristics in a microregion.

A method is also considered in which the magnetic sample which is the object to be measured is divided by cutting process or the like and measured by a VSM or the like so that the magnetic characteristics in a microregion is measured. However, the inherent magnetic characteristics of the magnetic sample cannot be measured due to the damage to the surface layer of the magnetic sample caused by the process.

In order to measure the magnetic characteristics in a microregion of a magnetic sample without processing the magnetic sample, a MFM (magnetic force microscopy), a SHPM (scanning hall probe microscopy) or the like is used.

The MFM uses the measuring head composed of a magnetic substance to scan the surface of a sample, so that the magnetic characteristics in a microregion can be precisely measured. However, as it is necessary to move the measuring head of the MFM close to the surface of the sample, and unlike the B-H curve tracer, the sample cannot become a part of the closed magnetic circuit, the measurement will be definitely affected by the demagnetizing field Hd due to the magnetic pole present on the surface of the magnetic sample.

As the effect of the demagnetizing field Hd largely depends on the shape of the sample, and in a thin plate magnetic sample such as a uniformly magnetized film magnet, the demagnetizing field Hd is substantially equal to the spontaneous magnetization J of the sample, the magnetic flux cannot be taken to the outside of the sample. That is, it is difficult to evaluate the magnetic characteristics of the uniformly magnetized thin plate magnetic sample by using a MFM.

PATENT DOCUMENT

Patent Document 1: WO2005/091315

SUMMARY

The present invention has been made in view of such situation, and it is an object of the present invention to provide a measurement device which is not affected by the demagnetizing field Hd and evaluates the remanent magnetization and its distribution in a microregion of a thin plate magnetic sample such as the thin film magnet by using the magnetic flux leakage due to the remanent magnetization.

One aspect of the present invention provides a magnetic measurement device for measuring the remanent magnetization of a thin plate magnetic sample, wherein the magnetic measurement device comprises a magnetic field generating part which applies a magnetic field to magnetize the first region and the second region of the magnetic sample in reciprocally opposite directions, and a measuring part which measures the magnetic field of the magnetic sample has been magnetized by the magnetic field generating part and outputs the magnetic field as the remanent magnetization of the magnetic sample. As the magnetized magnetic sample is measured by using such a structure in the present invention, in a case where an external magnetic is applied in the measurement, the measuring part can approach the surface of the sample without considering the effect of the applied external magnetic field on the measuring part. In addition, as the first region and the second region are magnetized in reciprocally opposite directions, the magnetic flux leakage due to the remanent magnetization of the magnetic sample can be properly measured without being affected by the demagnetizing field.

In one aspect of the present invention, the magnetic field generating part may have at least a pair of magnetic poles with different signs and magnetizes the magnetic sample with those magnetic poles.

In one aspect of the present invention, the magnetic field generating part may produce a magnetic field with damped oscillation to magnetize the magnetic sample.

In one aspect of the present invention, the magnetic field generating part may scan the surface of the magnetic sample while simultaneously producing an alternating magnetic field on local regions to magnetize the magnetic sample.

Further, any combinations of the constituent elements mentioned above, and the embodying of the present invention changed between methods or systems are still effective as embodiments of the present invention.

According to the present invention, the magnetic characteristics in a microregion (i.e., the distribution of the magnetic characteristics) of the thin plate magnetic sample can be evaluated by providing a magnetic measurement device which comprises a magnetic field generating part which applies a magnetic field to the thin plate magnetic sample (such as the magnet thin film) and magnetizes the first region and the second region of the magnetic sample in reciprocally opposite directions, and a measuring part which measures the magnetic flux leakage due to the remanent magnetization in the magnetic sample magnetized by the magnetic field generating part.

BRIEF DESCRIPTION OF THE DRAWINGS

FIG. 3(a) is a view showing the distribution of the magnetic field in an example of magnetization of the magnetic field generating part, and FIG. 3(b) is a view showing the distribution of the magnetic field in the uniformly magnetized magnetic sample.

Figure 1:
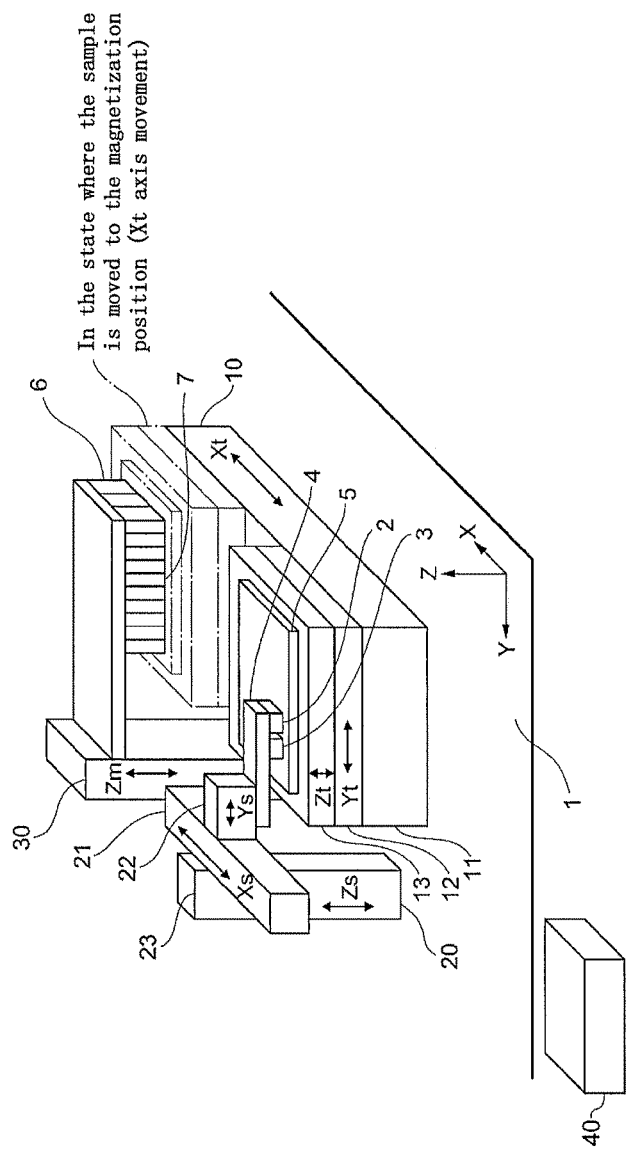
FIG. 1 is a schematic perspective view showing the magnetic measurement device of the present invention.

DESCRIPTION OF REFERENCE NUMERALS 1 base
2 measuring part
3 local magnetic field generating part
4 supporting arm
5 magnetic sample
6 magnetic field generating part
7 magnetic pole
10 XYZ platform
11 X platform
12 Y platform
13 Z platform
20 XYZ arm
21 X arm
22 Y arm
23 Z arm
30 driving system for Zm axis
40 control part

DETAILED DESCRIPTION OF EMBODIMENTS

Hereinafter, the preferable embodiments of the present invention will be described in detail with reference to the drawings. The same reference numeral is provided to the same or similar constituent element, means, treatment, etc., shown in the drawings, and the repeated descriptions can be properly omitted. In addition, these embodiments are exemplary and will not limit the present invention, and all the features disclosed in the embodiments or their combinations are not necessarily be limited to the substantial content in the present invention.

FIG. 1 is a schematic perspective view showing the whole structure of the magnetic measurement device of the present invention. In FIG. 1, a XYZ platform 10 which includes a X platform 11 which slides freely in the direction of the Xt axis (parallel to the X axis among the XYZ orthogonal three-axes), a Y platform 12 which is disposed on the X platform 11 and slides freely in the direction of the Yt axis (parallel to the Y axis among the XYZ orthogonal three-axes), and a Z platform 13 which is disposed on the Y platform 12 and slides freely in the direction of the Zt axis (parallel to the Z axis among the XYZ orthogonal three-axes) is disposed on a base 1, and a magnetic sample 5 with thin plate shape is positioned and fixed on the Z platform 13. In addition, the magnetic measurement device of the present invention includes a control part 40 which controls each part of the measurement device and determines the magnetic characteristics and the magnetic distribution on the base of the measured magnetic flux leakage.

The magnetic sample which is the object to be measured of the present invention includes an rare earth based magnet such as the R-T-B based magnet and the R-T based magnet, an oxide based magnet such as the Ba ferrite magnet and the Sr ferrite magnet, and a soft magnetic substance which, unlike magnet, does not have high coercivity. In addition, in a case where the magnetization direction of the magnetic sample is perpendicular to the flat shape of the thin plate sample, the present invention can be achieved by a simple structure, and in a case where the magnetization direction is in-plane, the present invention effectively functions.

The magnetic field generating part which magnetizes the magnetic sample 5 may be a magnetic field generating part 6 having at least a pair of magnetic poles with different signs, and may also be a local magnetic field generating part 3 which is disposed together with the measuring part 2 on the underside of the leading end of the supporting arm 4. With the magnetic field generating part 6 having at least a pair of magnetic poles with different signs, the first region and the second region of the magnetic sample 5 can be magnetized in reciprocally opposite directions. Moreover, in a way where the local magnetic field generating part 3 which is arranged on the underside of the front part of the supporting arm 4 produces an alternating magnetic field while simultaneously scanning the surface of the magnetic sample 5, the first region and the second region of the magnetic sample 5 can also be magnetized in reciprocally opposite directions.

The XYZ platform 10 may be driven by a motor, and may also be driven by a piezoelectric actuator. The movement stroke of the XYZ platform 10 in the X and Y directions may be set to cover the measurement region of the sample. In this respect, the whole measurement region of the sample can be measured. The movement stroke of the XYZ platform 10 in the X and Y directions is, for example, 10×10 mm. The movement stroke of the XYZ platform 10 in the Z direction may be set to be larger enough than the thickness of the sample. Accordingly, the magnetic sample 5 can easily approach the measuring part 2, the local magnetic field generating part 3 and the magnetic field generating part 6. The location resolution of the XYZ platform 10 in the X and Y directions may be smaller enough than the size of the magnetic domain of the magnetic sample 5. Therefore, the measurement in a microregion is possible. The location resolution in the X and Y directions may be, for example, 10 nm. Further, the location resolution of the XYZ platform 10 in the Z direction may smaller enough than the surface roughness of the magnetic sample 5. As a result, the measurement of the magnetic flux leakage due to the remanent magnetization in the sample without being affected by the surface morphology is possible.

A Z arm 23 which slides freely in the direction of the Zs axis (parallel to the Z axis among the XYZ orthogonal three-axes) is vertically arranged and fixed on the base 1, a X arm 21 which slides freely in the direction of the Xs axis (parallel to the X axis among the XYZ orthogonal three-axes) is disposed in front of the Z arm 23, and a Y arm 22 which slides freely in the direction of the Ys axis (parallel to the Y axis among the XYZ orthogonal three-axes) is disposed in front of the X arm 21. The supporting arm 4 is arranged on the underside of the Y arm 22, and the measuring part 2 and the local magnetic field generating part 3 are disposed on the underside of the leading end of the supporting arm 4.

The XYZ arm 20 may be driven by a motor, and may also be driven by a piezoelectric actuator. The movement stroke of the XYZ arm 20 in the X and Y directions may be set to cover the measurement region of the sample. In this respect, the whole measurement area of the sample can be measured. The movement stroke of the XYZ arm 20 in the X and Y directions is, for example, 100×100 mm. The movement stroke of the XYZ arm 20 in the Z direction may be set to be larger enough than the thickness of the sample. Accordingly, the magnetic sample 5 can easily approach the measuring part 2 and the local magnetic field generating part 3. The location resolution of the XYZ arm 20 in the X and Y directions should be smaller enough than the size of the magnetic domain of the magnetic sample 5. Thereby, the measurement of the distribution of the magnetic field in a microregion is possible. The location resolution in the X and Y directions may be, for example, 10 nm. Further, the location resolution of the XYZ arm 20 in the Z direction may be smaller enough than the surface roughness of the magnetic sample 5. As a result, the measurement of the magnetic flux leakage due to the remanent magnetization in the sample without the influence by the surface morphology is possible.

Although the XYZ platform 10 and the XYZ arm 20 are two structures that perform in the same action with respect to the relative position relationship between the magnetic sample 5 and the measuring part 2 as well as the local magnetic field generating part 3, by choosing different driving ways for each structure, the measurement of a microregion to the measurement of a large sample can be performed in one device. For example, the XYZ platform 10 may be driven by a motor to perform coarse motions and the XYZ arm 20 may be driven by a piezoelectric actuator to perform micro motions. Thereby, the movement towards any position of the sample at a high speed can be done by the coarse motions, and the remanent magnetization in microregions can be specifically measured by the micro motions.

A Zm axis-driving system 30 which slides freely in the direction of the Zm axis (parallel to the Z axis among the XYZ orthogonal three-axes) is vertically arranged and fixed on the base 1, and the magnetic field generating part 6 is disposed in front of the Zm axis-driving system 30. In the present embodiment, the first region and the second region of the magnetic sample are magnetized in reciprocally opposite directions by the magnetic field generating part 6. In order to magnetize the magnetic sample 5 by the magnetic field generating part 6, the XYZ platform 10 is moved to the magnetization position (the position indicated by the dashed lines in FIG. 1) where the magnetic pole 7 which radiates the magnetic field from the magnetic field generating part 6 to the outside is opposite to the surface of the magnetic sample 5, and the magnetic pole 7 adequately approach the surface of the magnetic sample 5 through the Zm axis-driving system 30. Thereby, the magnetic sample 5 can be uniformly magnetized or can be magnetized in accordance with the pattern possessed by the magnetic pole 7 of the magnetic field generating part 6.

Figure 2:
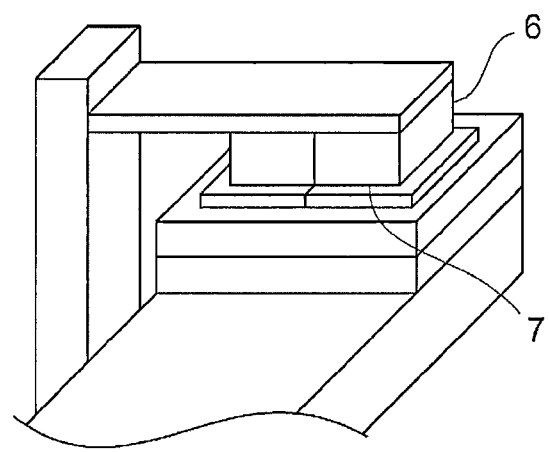
FIG. 2 is a schematic perspective view showing the magnetic field generating part having at least a pair of magnetic poles provided in the magnetic measurement device of the present invention.

FIG. 2 shows the magnetic field generating part 6. In FIG. 2, the magnetic sample 5 exists at the magnetization position (the position indicated by the dashed lines in FIG. 1) through the XYZ platform 10, and the magnetic pole 7 which radiates the magnetic field exists at the position close and opposite to the surface of the magnetic sample 5. In the embodiment shown in FIG. 2, magnetic poles 7 are composited of a pair of poles radiating magnetic field with different signs, however, the magnetic field generating part of the present invention is not limited thereto. The magnetic field generating part may be a matrix with tiny magnetic poles in which the adjacent magnetic poles have different signs between each other, and may also be a matrix generating a uniform magnetic field.

FIG. 3(a) is an example of the distribution of the magnetic flux leakage due to the remanent magnetization of the sample which is obtained by scanning the regions around the boundary between the magnetic fields radiated from the magnetic pole 7 with different signs using the measuring part 2 after the magnetic sample 5 is magnetized by the magnetic field generating part 6. The magnetization is performed in a way where the boundary between the magnetic fields with different signs radiated from the magnetic pole 7 is located in approximately the center of the measurement region, and the first region magnetized in a positive direction (the flat opposite to the measuring part 2 is the N pole) is at the right side of the boundary while the second region magnetized on a direction opposite to that for the first region (the flat opposite to the measuring part 2 is the S pole) is at the left side of the boundary.

The signal detected by the measuring part 2 has the maximum intensity in the region around the boundary between the first region and the second region, and has weak intensity in a region away from the boundary. This is because the large magnetic flux leakage of the magnetic sample presents around different boundaries in the magnetized state.

FIG. 3(b) is an example of the distribution of the magnetic flux leakage due to the remanent magnetization of the sample, which is obtained by the scanning of the measuring part 2 after the magnetic sample 5 has been magnetized by using a magnetic field generating part which can produce a uniform external magnetic field. The magnetic sample 5 is magnetized to saturation in a negative direction (the flat opposite to the measuring part 2 is the S pole).

Regardless of whether the magnetic sample 5 is magnetized to saturation or not, the signal detected by the measuring part 2 is weak. This is because in a case where magnetic sample 5 with thin plate shape is uniformly magnetized, its demagnetizing factor N become about 1, and hence, the magnetic polarization J possessed by the magnetic sample 5 is eliminated by the demagnetizing field Hd and the magnetic flux will not leak to the outside of the magnetic sample 5.

Figure 4B:
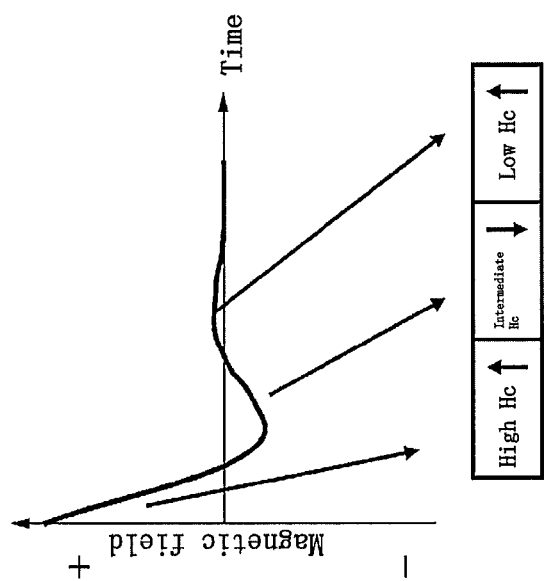
FIG. 4(a) and FIG. 4(b) are views showing the process for magnetizing the magnetic sample by a damped oscillation magnetic field.
Figure 4A:
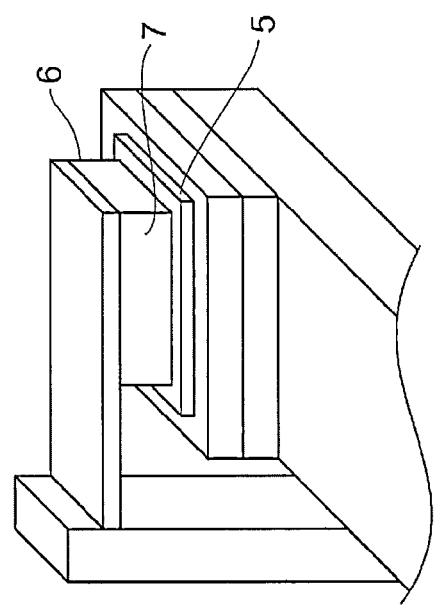

FIG. 4(a) is a view showing a process for magnetizing the magnetic sample 5 by a damped oscillation magnetic field. In this figure, the magnetic sample 5 exists at the magnetization position (the position indicated by the dashed lines in FIG. 1) through the XYZ platform 10, and the magnetic pole 7 which is the magnetic field generating part from which a magnetic field radiates in the present embodiment exists at the position close and opposite to the surface of the magnetic sample 5. The magnetic field radiated from the magnetic pole 7 may be a magnetic field (the damped oscillation magnetic field) in which the amplitude is decreased while the positive and negative pole signs are reversed in reciprocally opposite directions as the time passes.

Further, the procedure by which the magnetic sample 5 is magnetized by the damped oscillation magnetic field will be explained using FIG. 4(b). For the brief description, regions with three types of coercivities (i.e., high coercivity, intermediate coercivity, and low coercivity) exist in the magnetic sample 5, and the magnetic field radiated from the magnetic pole 7 decreases in amplitudes while reverses for three times in reciprocally opposite directions as the time passes.

First of all, with the magnetic field in a high intensity in the positive direction which is radiated from the magnetic pole 7, the whole magnetic sample 5 is magnetized in the positive direction. Then, with the magnetic field with an intermediate intensity in the negative direction which is radiated from the magnetic field 7, only the parts with intermediate coercivity and low coercivity in the magnetic sample 5 have their magnetization direction reversed to be negative. At this time, as the magnetic field with an intermediate intensity which is radiated from the magnetic pole 7 cannot reverse the magnetization of the part with high coercivity in the magnetic sample 5, the part with high coercivity is maintained in a magnetization state in the positive direction. Further, with the magnetic field in a low intensity in the positive direction which is radiated from the magnetic pole 7, only the part with low coercivity in the magnetic sample 5 have their magnetization direction reversed to be negative. At this time, as the magnetic field with an intermediate intensity which is radiated from the magnetic pole 7 cannot reverse the magnetization of the part with high coercivity in the magnetic sample 5, the part with intermediate coercivity is maintained in a magnetization state in the positive direction.

By the procedure mentioned above, the first region and the second region with different magnetization states in the positive and negative directions can be mixed in the magnetic sample 5. As the parts with different magnetization states are mixed in the magnetic sample 5, despite of its thin plate shape, the demagnetizing field Hd will be low and the magnetic flux leaked outside can be measured by the measuring part 2.

Figure 5:
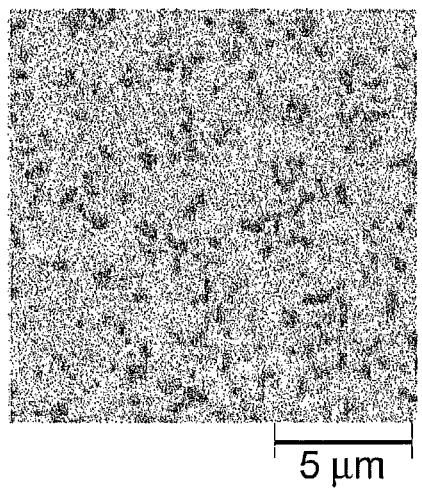
FIG. 5 is a view showing the distribution of the magnetic field in the magnetic sample magnetized by using a damped oscillation magnetic field.

FIG. 5 is an example of the distribution of the magnetic field in the magnetized magnetic sample 5 which is magnetized by producing the damped oscillation magnetic field using the magnetic field generating part 6. Thus produced damped oscillation magnetic field has a maximum intensity of 6400 kA/m.

The magnetic sample 5 magnetized by the damped oscillation magnetic field is in a state where regions (the magnetic domains) with a size of about 0.5 to 1.0 μm and different magnetization states are mixed. The size of the magnetic domain is substantially equal to the size of the crystal grain in the magnetic sample 5, and the distribution of the magnetic flux leakage reflecting that the remanent magnetization states of the crystal gain with the coercivity distribution are different in the positive and negative directions is measured.

Figure 6B:
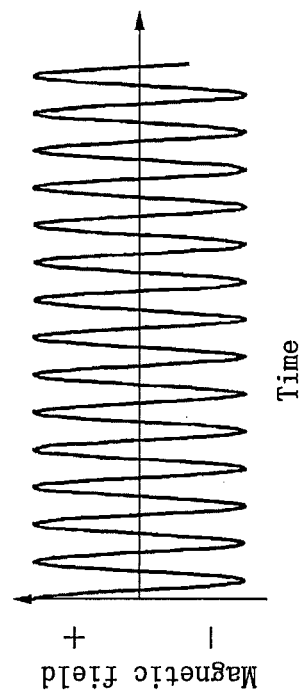
FIG. 6(a) and FIG. 6(b) are views showing the process for magnetizing the magnetic sample by applying an alternating magnetic field while simultaneously performing the scanning.
Figure 6A:
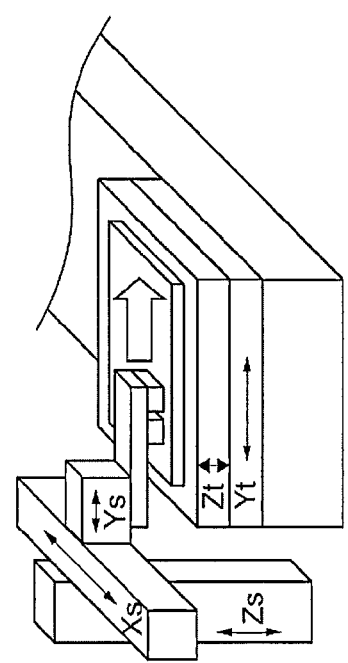

FIG. 6(a) shows the process in which the local magnetic field generating part 3 produces an alternating magnetic field and simultaneously performs the scanning and thereby magnetizing the magnetic sample 5 non-uniformly. In this figure, the magnetic sample 5 and the local magnetic field generating part 3 exist at the position opposite to the XYZ platform 10 and the XYZ arm 20, and the underside of the local magnetic field generating part 3 is close to the top of the magnetic sample 5. As shown in FIG. 6(b), the magnetic field radiated from the local magnetic field generating part 3 may be a magnetic field (an alternating magnetic field) in which the positive and negative pole signs are reversed as the time passes.

Figure 7:
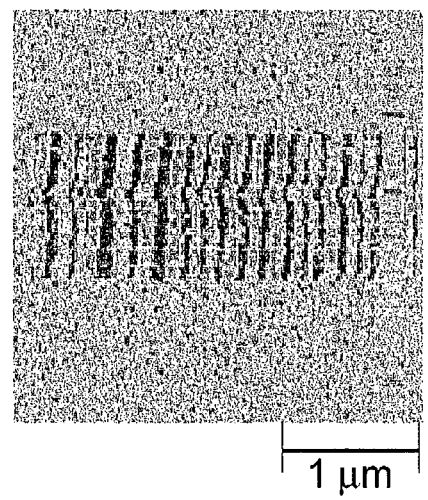
FIG. 7 is a view showing the distribution of the magnetic field of the magnetic sample having been magnetized by applying an alternating magnetic field while simultaneously performing the scanning.

FIG. 7 is an example of the distribution of the magnetic field in the magnetic sample 5 which is magnetized by producing an alternating magnetic field while simultaneously performing the scanning using the local magnetic field generating part 3. After the magnetic sample 5 is uniformly magnetized to saturation (the same as that in FIG. 3B) by the magnetic field generating part 6, only the central part of the measurement region is magnetized by producing an alternating magnetic field while simultaneously performing the scanning using the local magnetic field generating part 3.

Although the uniformly magnetized part of the magnetic sample 5 (the upper and lower parts of the measurement region) is magnetized to saturation, the magnetic flux does not leak outside due to the demagnetizing field and the signals detected by the measuring part 2 is weak. On the other hand, the part (the center of the measurement region) magnetized by producing an alternating magnetic field while simultaneously performing the scanning using the local magnetic field generating part 3 can be deemed as the part in which the signals detected by the measuring part 2 is large, and by the way where the magnetic sample 5 is alternatively magnetized in the positive and negative directions, the influence caused by the demagnetizing field is small and the magnetic flux leaks outside.

As shown in FIG. 7, the part of the magnetic sample with a coercivity equal to or lower than that corresponding to the intensity of the magnetic field can also be un-uniformly magnetized by an alternating magnetic field with a specified intensity, and by changing the intensity of the magnetic field sequentially and performing the same measurement, the distribution of the magnetic characteristics of the magnetic sample can be obtained.

What is claimed is:

1. A magnetic measurement device for measuring remanent magnetization of a plate magnetic sample, the plate magnetic sample having a flat shape with a flat major surface and a magnetization direction perpendicular to the flat major surface, the magnetic measurement device comprising:
    a magnetic field generating part which comprises at least a pair of adjacent magnetic poles with different signs, and magnetizes said magnetic sample by the magnetic poles by applying a magnetic field and magnetizing a first region of the flat major surface of the magnetic sample in a first direction and a second region of the flat major surface of the magnetic sample in a second direction, the first direction and the second direction being perpendicular to the flat major surface of the magnetic sample and opposite to each other, and forming a boundary in the magnetic sample between the first region and the second region, the first region and the second region being adjacent to each other via the boundary; and
    a measuring part which measures the magnetic field of the magnetic sample magnetized by the magnetic field generating part and outputs the magnetic field as the remanent magnetization of the magnetic sample.

2. The magnetic measurement device of claim 1, wherein, the magnetic field generating part produces a damped oscillation magnetic field to magnetize the magnetic sample.

3. The magnetic measurement device of claim 1, wherein, the magnetic field generating part scans the flat major surface of the magnetic sample while simultaneously produces an alternating magnetic field to magnetize the magnetic sample.

* * * * *